United States Patent [19]

Lightfoot

[11] 4,064,551
[45] Dec. 20, 1977

[54] APPARATUS FOR INSERTION AND WITHDRAWAL OF PRINTED CIRCUIT BOARDS INTO AND FROM MOUNTING FRAMES

[75] Inventor: Richard Lightfoot, Dunrobin, Canada

[73] Assignee: Northern Telecom Limited, Montreal, Canada

[21] Appl. No.: 745,651

[22] Filed: Nov. 29, 1976

[51] Int. Cl.² .................................. H02B 1/02
[52] U.S. Cl. ............................. 361/399; 339/45 M
[58] Field of Search ............ 361/399, 415; 339/65 M, 339/45 R, 45 M; 211/41

[56] References Cited
U.S. PATENT DOCUMENTS

| T876,004 | 7/1970 | Andreini et al. | 339/45 M |
| 3,798,507 | 3/1974 | Damon | 361/415 |
| 3,952,232 | 4/1976 | Coules | 361/415 |

Primary Examiner—David Smith, Jr.
Attorney, Agent, or Firm—Sidney T. Jelly

[57] ABSTRACT

Printed circuit boards for mounting in a mounting frame, as in telecommunications systems, have a faceplate mounted on the front edge of the board by means of a flange extending along one edge of the faceplate. At one end of the faceplate a slot is formed in the front flange of the faceplate, the slot spaced from the top flange approximately the thickness of the printed circuit board. A further flange extends along the edge of the slot remote from the printed circuit board, and a cam member is pivotally mounted in the slot. The cam member pivots in two opposed holes, one in the further flange and one in the printed circuit board. The cam member has an elongate body portion with at least one rib on the body portion which snaps into the slot in a closed condition. A cam portion extends from one end of the body portion, the cam portion extending laterally from the faceplate and engaged behind a frame member when cam member is in the closed position. Pivotting of the cam member can assist in inserting and withdrawing the printed circuit board.

4 Claims, 14 Drawing Figures

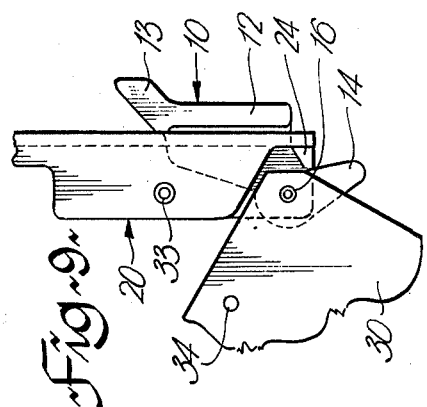
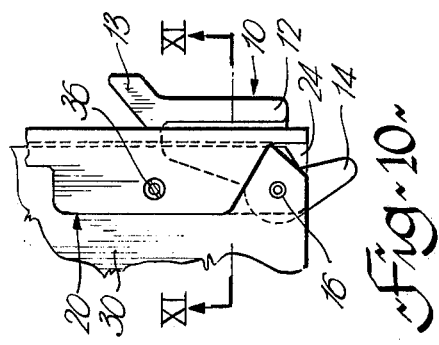
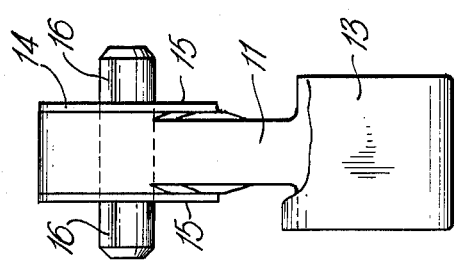
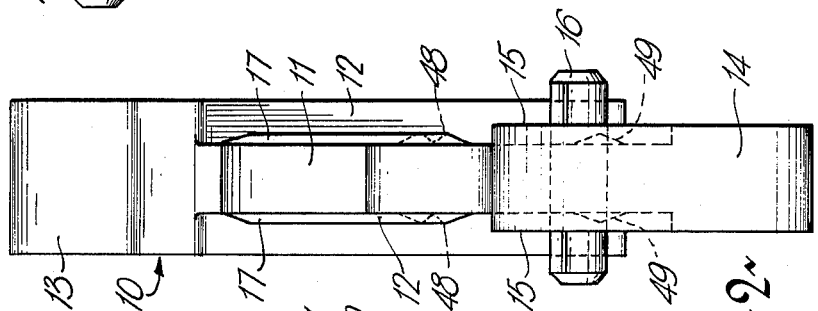
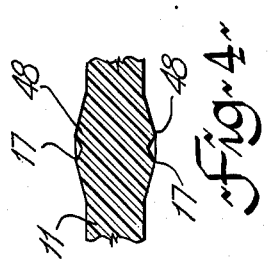
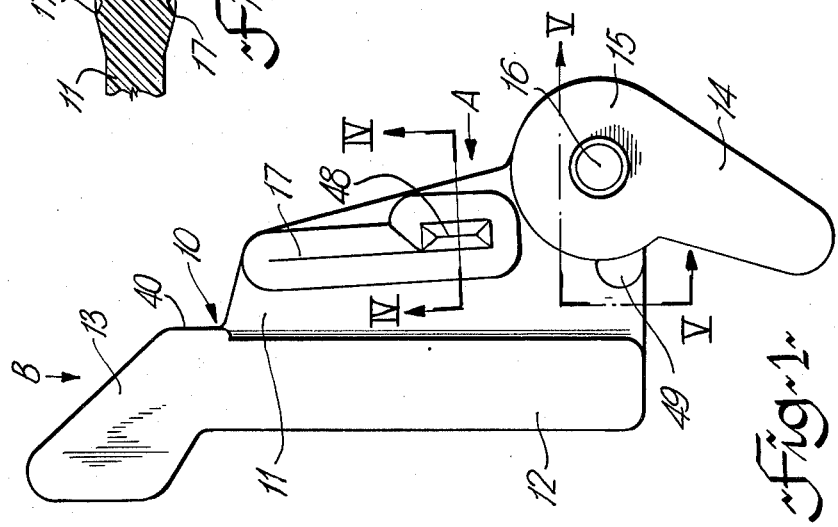

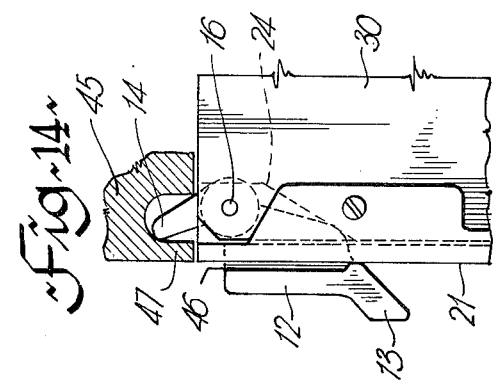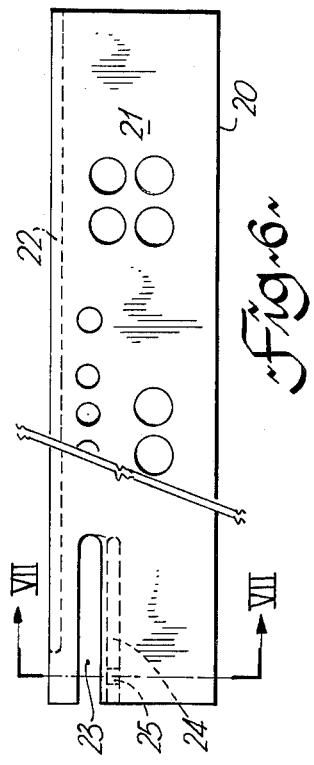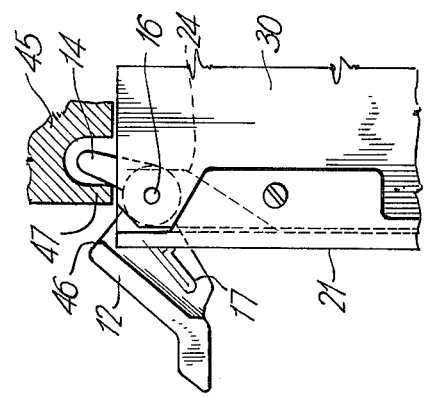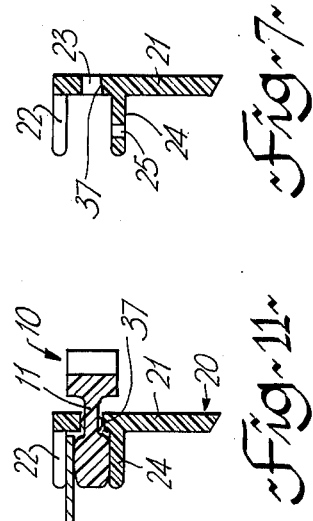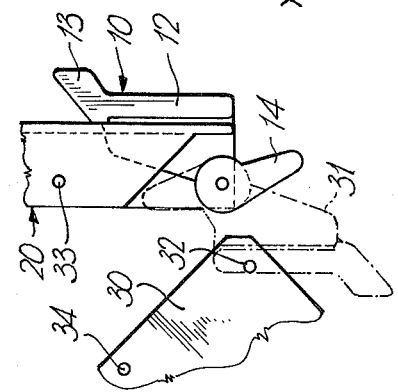

APPARATUS FOR INSERTION AND WITHDRAWAL OF PRINTED CIRCUIT BOARDS INTO AND FROM MOUNTING FRAMES

This apparatus relates to apparatus for insertion and withdrawal of printed circuit boards, particularly such as are used in telecommunications systems, and also to printed circuit boards embodying such apparatus.

Printed circuit boards, hereinafter referred to as PCB's, for telephone and similar switching and circuit requirements, are generally mounted in frames, with a large number of PCB's mounted thereon, with as high a density as possible, to save space. A typical PCB, comprising a flat rectangular sheet of insulating material, such as glass-fibre reinforced resin, has a number of components assembled thereon and carries a rear connector block at what, for convenience, is called the rear end. At the front end is a faceplate or block. The PCB's slide into guide channels in the frame, the boards usually in a vertical plane, and the faceplate at the front closes off the particular space in the frame occupied by the PCB.

On insertion of the PCB, the rear connector block meets with contacts in the rear of the frame. It is important that the PCB is completely inserted to ensure satisfactory contact is made between the rear connector block and the contacts. As there are usually quite a number of connections between the rear connector block and terminals, insertion forces rise quite steeply as the final insertion movement is made.

Once inserted, the faceplate presents a flat surface. With close packing of PCB's in the frame, there can be a difficulty in getting a good grip on the faceplate in order to withdraw a PCB, particularly for the initial withdrawal movement when the rear connector block is disengaged from the terminals.

The present invention provides an apparatus for inserting a PCB into, and withdrawing a PCB from a frame, a cam member being provided which engages with part of the frame to provide a high insertion force for the final part of the insertion of a PCB, gives a positive indication of full insertion, and provides an initial high withdrawal force on the PCB to initiate withdrawal of the PCB, after which the PCB can easily be removed from the frame.

The invention will be readily understood by the following description of an embodiment in conjunction with the accompanying drawings, in which:

FIG. 1 is a plan view of a camming member;

FIGS. 2 and 3 are side and end views of the camming member of FIG. 1, in the directions of arrows A and B respectively;

FIGS. 4 and 5 are cross-sections on the lines IV—IV and V—V respectively of FIG. 1;

FIG. 6 is a front view of the faceplate;

FIG. 7 is a cross-section on the line VII—VII of FIG. 6;

FIGS. 8, 9 and 10 illustrate the assembly of camming member, PCB and front connector block;

FIG. 11 is a cross-section on the line XI—XI of FIG. 5;

FIGS. 12, 13 and 14 illustrate sequentially the final insertion movement of a PCB by the camming member of FIGS. 1 to 5.

The cam member 10 has an elongate body portion 11 with a flange 12 extending along one edge. An enlargement 13 at one end of the flange 12 forms a handle which can be engaged by a finger or thumb or a user.

At the end of the body portion 11 remote from the enlargement 13 is a cam portion 14. The junction of the cam portion 14 and body portion 11 forms opposed bearing surfaces 15, and a pivot pin 16 extends from each surface 15. On each side of the body portion 11, extending laterally and spaced from the flange 12 is a rib 17. The purpose of the rib 17 is to provide positive location when the cam member is in the closed condition, that is when the PCB is fully inserted. The ribs engage with associated parts of the front connector block, as will be described later. Only one rib 17 need be provided, on one side of the body portion, but by providing two ribs, one on each side of the body portion, this distributes twice the hold or latching forces with even wear on both sides and also provides self-centering features for visual effect.

FIG. 6 is a front view of a faceplate 20, FIG. 7 being a cross-section on the line VII—VII of FIG. 6. The faceplate 20 has a main planar front flange 21 with a top flange 22 extending along one edge. At one end of the connector block there is an open-ended slot 23 extending parallel to and spaced down a short distance from the top flange 22. As will be seen, the distance between the slot 23 and the top flange 22 is approximately equal to the thickness of the PCB to be attached to the faceplate.

A further short flange 24 extends from the front flange 21 at the end of the faceplate at which is provided the slot 23. The short flange 24 extends approximately the length of the slot 23, is positioned just below the slot and is parallel to the top flange 22. The slot 23 is slightly wider than the thickness of the body portion 11 of the cam member 10 but narrower than the thickness over the ribs 17. A hole 25 extends through the short flange 24 near the outer end thereof, of a size to provide a bearing for one of the pins 16 of the cam member. The top flange 22 stops short of the end of the faceplate, to leave exposed the end of the short flange 24 and the hole 25.

FIGS. 8, 9 and 10 illustrate a cam member 10 assembled to the faceplate 20 and steps in the attachment of a PCB 30 to the assembled faceplate and cam member.

The cam member is assembled to the faceplate by presenting the cam member approximately in the position outlined by dotted lines 31, the lower pin 16 being inserted in the hole 25 in the short flange 24. The cam member is left in this position while the PCB 30 is attached. The PCB 30 is then presented to the faceplate, at an angle, as illustrated in FIG. 8. The PCB has a hole 32 in the corner and this hole is positioned over the top pin 16, the position then being as illustrated in FIG. 9. The PCB is then swung around to engage under the top flange 22. The PCB is held attached to the faceplate by rivets passing through holes in the top flange 22 and the PCB, one of the holes in the top flange indicated at 33 and the cooperating hole in the PCB indicated at 34, a rivet indicated at 36 in FIG. 10. The cam member can then be swung round, the body portion entering the slot 23 with the ribs 17 snapping through the slot.

As seen in FIG. 11, one edge 37 of the slot 23 is inclined, the slot being therefore slightly narrower at the outside on what can be considered as the front face of the front flange 21. As the cam member 10 is pivotted round, the ribs 17 cause the top edge portion of the slot 23 to bend upward slightly for the ribs to snap through, the ribs 17 finally positioned in the slot, as seen in FIG.

11. This gives a positive snap action. The enlargement 13, of the cam member, which forms a sort of handle or finger engaging portion, has a local step, indicated at 40 in FIG. 1, which engages with the front surface of the front flange 21 to give a positive position to the cam member when closed, that is when pivotted round to the position as in FIG. 10.

FIGS. 12, 13 and 14 illustrate the actuation of the cam member to push a PCB completely home in a support frame. The cam member 10 is pivotted to its open position, that is with the cam member extending at right angles to the connector block 21. This is as illustrated in FIG. 12. The PCB 30 is inserted into the frame, usually sliding in guides at its edges. As the PCB nears the fully inserted position, the cam portion 14 enters past a frame member 45 and the forward end 46 of the body portion 11 is adjacent to the frame member 45. The cam member 10 is pivotted, in the direction of the arrow X in FIG. 12. This causes the cam portion 14 to engage behind the frame member 45 and the reaction of the cam portion pushing against the frame member 45 pushes the PCB into place. FIG. 13 illustrates the situation with the cam member pivotted through approximately 45° and FIG. 14 illustrates the situation when the cam member is fully pivotted, the PCB fully inserted and the cam member snapped into place and held there by interengagement between the ribs 17 and the slot 23.

Thus the fact that the cam member 10 is felt to clip home gives a positive indication that the PCB is fully inserted. Also, the camming action of the cam member aids in pushing the PCB fully home, as insertion forces increase with increasing engagement between contacts on the frame and the rear connector block.

Instead of using the cam member 10 to lever the PCB in, it is possible to insert the PCB by pushing directly on the fireplate. In doing so, the cam member engages with, and is pivotted by, the frame member 45 contacting the front surface 46 on the cam member. Full insertion is indicated by the cam member snapping home.

As illustrated in FIGS. 1 to 4, an additional short rib 48 is formed on each side of the body portion, adjacent and parallel to the ribs 17, and at the end of the ribs 17 closest to the cam portion 14. This additional raised area keeps the cam member cocked ready for insertion, instead of the cam member falling down to an angle less than 90° to the faceplate and possibly interfering with insertion.

Also, as seen in FIGS. 1, 2 and 5, small dimples 49 can be provided on the body portion 11 adjacent the cam portion 14, for centering the cam member in the slot 23 when the cam member is in the latched position.

For removal of a PCB, the cam member 10 is pivotted out, against the frame member 47, the cam portion 14 bearing against the frame member 47, levering the PCB outward. When the cam member has been pivotted through about 90° generally from the position in FIG. 14 to the position in FIG. 12, the contacts in the frame will be disengaged from the rear connector block and the PCB slides out easily.

By molding the pivot pin 16 as part of the cam member, cost reduction is obtained, avoiding separate parts with associated labour costs. No springs are required, with the provision of the ribs 17. Cost savings of over 60% have been obtained with the present invention, over conventional assemblies.

What is claimed is:

1. Apparatus for insertion and withdrawal of printed circuit boards into and from a mounting frame, comprising:

an elongate faceplate on a front edge of a printed circuit board, said faceplate including a front flange and a top flange extending along one long edge of the front flange on a rear surface thereof, the printed circuit board attached thereto; an open ended slot in said front flange at one end thereof, the slot spaced from and parallel to said top flange; a further flange on said rear surface of said front flange; extending along said slot on the side thereof remote from said top flange, and a hole through said further flange near the open end of said slot;

a cam member pivotally supported on said further flange and including an elongate body portion, a pivot at one end of said body portion, said pivot including a pin pivotal in said hole in said further flange; a cam portion extending from said one end of said body portion; and at least one rib on one side of said body portion extending longitudinally thereof, the overall thickness over said body portion and rib slightly greater than the width of said slot in said faceplate;

said cam member pivotal from a first position with the longitudinal axis of the cam member normal to the plane of the front flange of said faceplate, a major part of the body portion beyond the slot in the faceplate and extending forwards from said faceplate and the cam portion extending rearward of said faceplate, to a second position with said body portion in said slot, said rib snapped at least part way through said slot and said cam portion extending laterally from the end of the faceplate for engagement behind a frame member of said mounting frame.

2. Apparatus as claimed in claim 1, said top flange stopped short of the end of the faceplate at the end at which is formed said slot, to expose the end of said further flange and said hole; a further hole adjacent to a corner of the printed circuit board at said slot, said pivot at one end of said body portion of said cam member including a further pin pivotal in said further hole, said pin and said further pin positioned on either side of said body portion.

3. Apparatus as claimed in claim 1, including a rib on each side of said body portion.

4. Apparatus as claimed in claim 1, said slot having opposed edges, one of said edges inclined to the front face of said faceplate, whereby said slot is wider at a rear face of said faceplate.

* * * * *